United States Patent [19]
Hiroi

[11] Patent Number: 6,089,463
[45] Date of Patent: Jul. 18, 2000

[54] COOLING SYSTEM OF A SEMICONDUCTOR TESTING DEVICE

[75] Inventor: Hajime Hiroi, Tokyo, Japan

[73] Assignee: Ando Electric Co., Ltd., Tokyo, Japan

[21] Appl. No.: 09/094,910

[22] Filed: Jun. 12, 1998

[30] Foreign Application Priority Data

Jun. 30, 1997 [JP] Japan ..................................... 9-190407

[51] Int. Cl.$^7$ .................................. F24F 7/00; F28F 7/00
[52] U.S. Cl. ...................... 236/49.3; 62/259.3; 165/80.3; 417/45
[58] Field of Search ............................. 417/45; 236/49.3, 236/35; 62/183, 184, 259.3; 165/80.3; 454/184

[56] References Cited

U.S. PATENT DOCUMENTS

| | | | |
|---|---|---|---|
| 3,058,663 | 10/1962 | Barnard | 236/51 X |
| 4,425,766 | 1/1984 | Claypole | 236/35 X |
| 5,718,373 | 2/1998 | Kim et al. | 236/35 |

Primary Examiner—William Wayner
Attorney, Agent, or Firm—Flynn, Thiel, Boutell & Tanis, P.C.

[57] ABSTRACT

There is provided a cooling system of a semiconductor testing device wherein the number of revolutions of a fan is controlled so as to obtain proper air-flow corresponding to a heating value for every operating mode of the measuring unit, thereby preventing power from being wasted. The cooling system of a semiconductor testing device comprises a fan for cooling the measuring unit by the rotation of a DC motor, a temperature sensor for measuring a temperature of the measuring unit which is cooled by the fan, and a temperature control/power supply unit for supervising temperature information which is supplied from the temperature sensor and executing optimum control of the number of revolutions of the fan corresponding to a heating value of the measuring unit for every operating mode. The temperature control/power supply unit executes optimum control of the number of revolutions of the fan by controlling a voltage of the DC motor to obtain air-flow needed for cooling the measuring unit corresponding to the heating value.

4 Claims, 4 Drawing Sheets

|   | U1 | U2 | U3 |
|---|----|----|----|
| a | ○  | ○  | ○  |
| b | ✕  | ○  | ○  |
| c | ○  | ✕  | ✕  |
| d | ✕  | ✕  | ✕  | ns
COOLING SYSTEM OF A SEMICONDUCTOR TESTING DEVICE

BACKGROUND OF THE INVENTION

1. Field of the Invention

The present invention relates to a cooling system of a semiconductor testing device, particularly to a cooling system of a semiconductor testing device for controlling the number of revolutions of a fan so as to obtain airflow corresponding to a heating value of a measuring unit by use of the fan which is driven by a DC motor, thereby preventing a power from being wasted.

2. Prior Art

A semiconductor testing device generally comprises a body 200 and test heads 300 as shown in FIG. 3(A), wherein electric characteristics of a device to be measured mounted on the test heads 300 is tested by the body 200, namely, by the control carried out by the body 200.

In such a semiconductor testing device, there has been employed a system shown in FIG. 4 for cooling a measuring unit 80A which is a mounted in the body 200 or in the test heads 300.

That is, in FIG. 4, a fan 60A is provided adjacent to the measuring unit 80A, wherein a three-phase AC motor 62A of the fan 60A is rotated to suck air heated by heat produced by the measuring unit 80A.

At this time, since there produces a negative pressure at the part where air is sucked, outside cool air is taken in this part through an open portion of the measuring unit 80A provided at the opposing position of the fan 60A.

As a result, the measuring unit 80A dissipates or radiates heat so that the measuring unit 80A is cooled.

In this case, the number of revolutions of the three-phase AC motor 62A for driving the fan 60A is determined by a frequency of the AC power supply of the motor and the number of poles of a revolving field of the motor. From this, the number of revolutions of the three-phase AC motor 62A has generally a specific fixed value.

That is, the following well known relationship or expression is established in the three-phase AC motor 62A suppose that the number of revolutions is Nac (unit: rps), the frequency of AC power supply is F (unit: Hz), and the number of poles of the revolving field is p.

$$Nac = 2F/p \quad (1)$$

In the expression (1), the frequency F of the AC power supply is generally 50 Hz or 60 Hz, and the number of poles p of the revolving field is a fixed value which is determined when manufacturing a motor.

Accordingly, the number of revolutions Nac of the three-phase AC motor 62A becomes a fixed value as evident from the expression (1).

The air-flow to be needed for cooling the measuring unit 80A is determined by the number of revolutions Nac of the three-phase AC motor 62A and a sectional area of the fan 60A.

Further, in FIG. 4, a temperature sensor 50A is generally a thermal relay type which operates when the temperature exceeds a specific temperature (anomalous temperature region), and the operating modes of the relay (ON/OFF) are transmitted to a power supply controller 70 via a signal cable 51A.

Accordingly, the power supply controller 70 cuts off a power supplied to the measuring unit 80A via a power supply cable 81A. That is, the measuring unit 80A has been conventionally cooled by the fan 60A employing the three-phase AC motor 62A, and the power supply has been cut off when an ambient temperature of the measuring unit 80A reaches an anomalous temperature region.

In the prior art as mentioned above in FIG. 4, the air-flow needed for cooling the measuring unit 80A is determined by the number of revolutions Nac of the three-phase AC motor 62A and the sectional area of the fan 60A.

However, as evident from the expression (1), since the number of revolutions Nac of the three-phase AC motor 62A is a fixed value and the sectional area of the fan 60A is constant, the air-flow presented for cooling the measuring unit 80A is invariant regardless of whether the measuring unit 80A is in standby condition (heating value Qa is small) or in operating condition (heating value Qa is large) when the three-phase AC motor 62A is used.

For example, suppose that the semiconductor detecting device shown in FIG. 3(A) has measuring units U1, U2, U3 and there are operating modes shown in FIG. 3 (B) wherein standby condition is denoted by x and operating condition denoted by ○.

Of these operating modes, all measuring units U1 to U3 are in operating condition in the case of a, and the measuring units U2 and U3 are in operating condition while other measuring unit U1 is standby condition in the case of b, and one measuring unit U1 is in operating condition while the other measuring units U2 and U3 are in standby condition in the case of c, and all the measuring units U1 to U3 are in standby condition in the case of d.

Accordingly, in the case of FIG. 3(B), the heating value Qa is the largest in the case of a and it decreases in the order of b and c, and it is the smallest in the case of d. That is, there occurs a case where the power to be consumed by, i.e., the heating value of the measuring units is varied according to the operating condition or standby condition depending on devices to be used in the semiconductor testing device (FIG. 3(A)).

However, air-flow needed for cooling the measuring unit can not be changed corresponding to the heating value Qa because the fan 60A which is driven by the three-phase AC motor 62A has been used.

Accordingly, even if the measuring unit 80A is in standby condition, there is needed air-flow which is the same as that for cooling the measuring unit 80A in a state of the maximum heating value. For example, even in the state of d in FIG. 3(B) (all the measuring units are in standby condition), there requires air-flow needed for cooling in the case of a (all the measuring units are in operating condition).

Accordingly, even in standby condition, i.e., in the case of d, the number of revolutions of the fan 60A increases by the air-flow needed for cooling the measuring unit 80A in the case of a, thereby power is consumed more than it is needed, and hence power is wasted.

SUMMARY OF THE INVENTION

It is an object of the invention to provide a cooling system of a semiconductor testing device for controlling the number of revolutions of a fan so as to obtain proper air-flow corresponding to the heating value for every operating mode of a measuring unit so as to prevent the power used by the fan from being wasted.

To achieve this object, a cooling system of a semiconductor testing device for cooling a measuring unit 40A of the semiconductor testing device according to the present invention comprises a fan 20A for cooling the measuring unit 40A by the rotation of a DC motor 22A, a temperature sensor 10A for measuring a temperature of the measuring unit 40A which is cooled by the fan 20, and a temperature control-power supply unit (also represented as temperature control/power supply unit) 30 for supervising temperature information T which is supplied from the temperature sensor 10A and executing optimum control of the number of revolutions Ndc of the fan 20A corresponding to a heating value Qa of the measuring unit 40A for every operating mode.

Accordingly, with the arrangement of the present invention, since the fan 20A is driven by the DC motor 22A, for example, when a voltage V of the DC motor 22A is controlled (expression (1)), the number of revolutions Ndc of the fan 20A can be controlled so as to obtain proper air-flow corresponding the heating value Qa for every operating mode of the measuring unit 40A (FIG. 1), thereby preventing power from being wasted.

BEST MODE FOR CARRYING OUT THE INVENTION

Described hereinafter are the first and second embodiments of the present invention.

Figure 1:
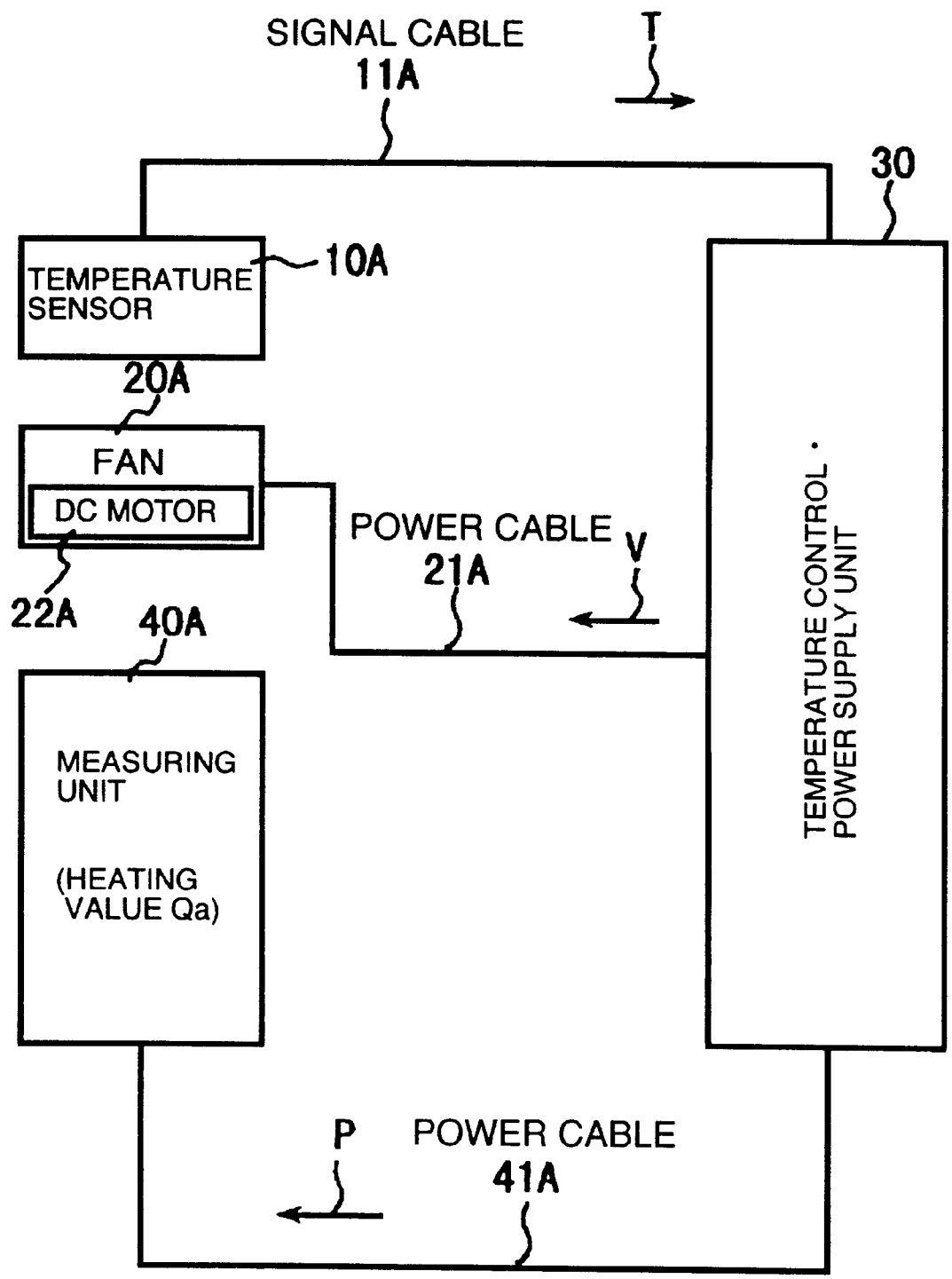
FIG. 1 is a view showing a cooling system of a semiconductor testing device according to a first embodiment of the invention.

First Embodiment (FIG. 1):

In FIG. 1 showing a cooling system of a semiconductor testing device according to the first embodiment of the invention, denoted by 10A is a temperature sensor, 20A is a fan, 30 is a temperature control-power supply unit, and 40A is a measuring unit.

The measuring unit 40A is mounted in the body 200 or in the test head 300 of the semiconductor testing device, and it produces heat upon receipt of power and it needs to be cooled.

The temperature sensor 10A measures an ambient temperature of the measuring unit 40A, and transmits temperature information T of the measuring unit 40A to the temperature control-power supply unit 30 via a signal cable 11A.

The fan 20A is disposed adjacently to the measuring unit 40A for drawing air, which is heated by the heat produced by the measuring unit 40A when a DC motor 22A thereof is rotated, so as to cool the measuring unit 40A by cool air from the outside.

The number of revolutions of the DC motor 22A for driving the fan 20A is represented by the following expression.

$$Ndc = K(V - rI)/\phi \quad (2)$$

where in the DC motor 22A, the number of revolutions is Ndc (unit: rps), a voltage of the DC power supply of the motor is V (unit: V), a resistor of an armature circuit of the motor is r (unit: ω), a current of the armature of the motor is I (unit: A), the number of magnetic flux of each pole is φ (unit: Wb) and a constant which is determined by the structure of the motor is K.

In the expression (2), there are methods of controlling the number of revolutions Ndc such as a method of changing the voltage V of the DC power supply, a method of changing the resistor r of the armature circuit and a method of changing the number of magnetic flux φ of each pole.

Of these methods, there has been generally employed the method of controlling or changing the voltage V of the DC power supply. Accordingly, in the first embodiment, the fan 20A employing the DC motor 22A is connected to the temperature control-power supply unit 30 via a power cable 21A so as to control the voltage V, thereby controlling the number of the revolutions of the fan 20A.

Connected to the temperature control-power supply unit 30 are the temperature sensor 10A via the signal cable 11A, the fan 20A via the power cable 21A and the measuring unit 40A via a power cable 41A.

With such an arrangement, the temperature control-power supply unit 30 controls the voltage V of the DC motor 22A to control the number of revolutions of the DC motor 22A so as to obtain air-flow needed for cooling the measuring unit 40A based on temperature information T from the temperature sensor 10A.

Further, the temperature control-power supply unit 30 supplies the power P to the measuring unit 40A required to energize the measuring unit for a plurality of different operating modes. The temperature control/power supply unit 30 also stops the supply of the power P to the measuring unit 40A when the temperature of the measuring unit 40A reaches an anomalous temperature value at which the measuring unit 40A can not be cooled by the fan 20A, and rotates the fan 20A at the maximum number of revolutions to cool the measuring unit 40A.

Figure 2:
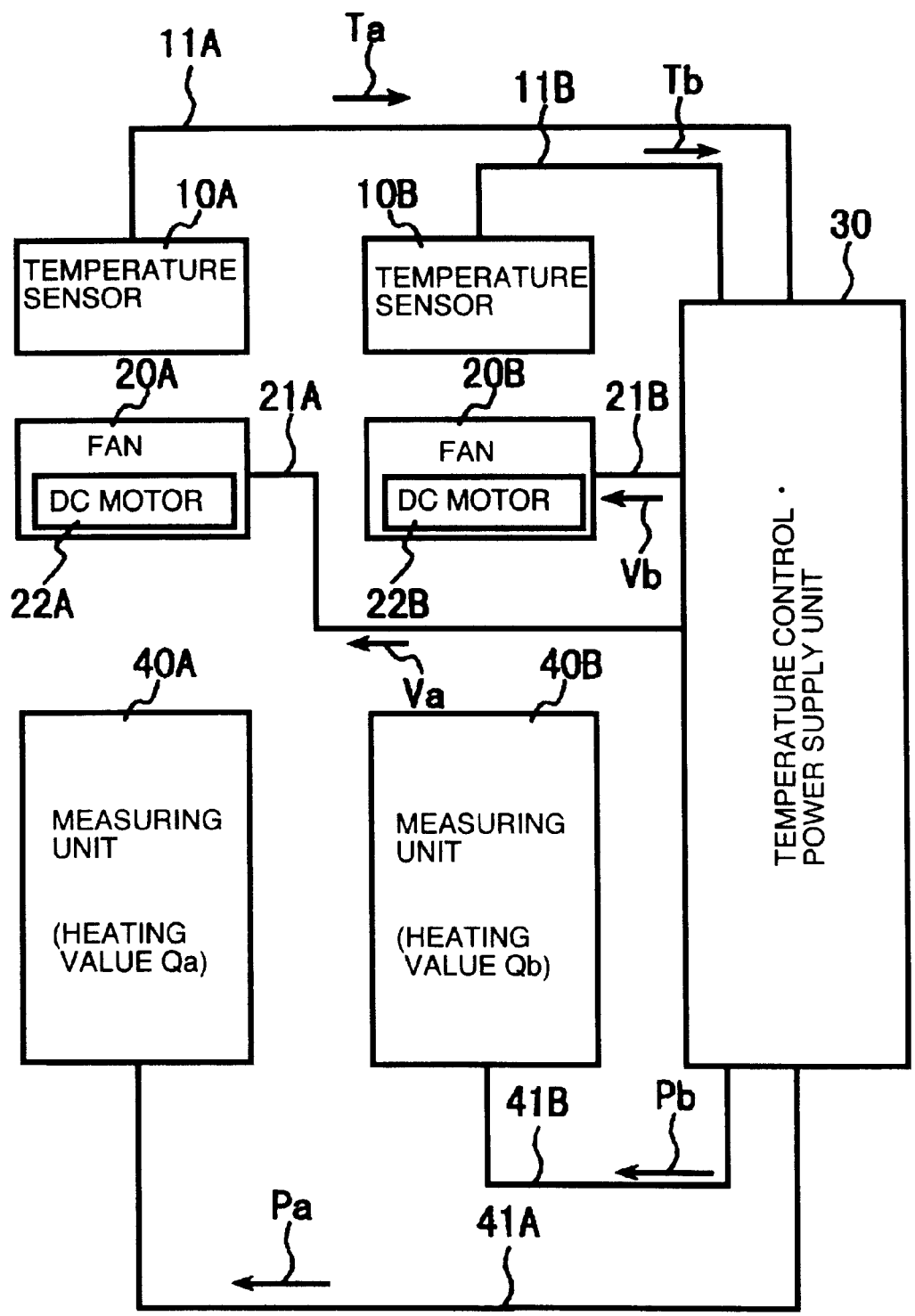
FIG. 2 is a view showing a cooling system of a semiconductor testing device according to a second embodiment of the invention.
Figure 3:
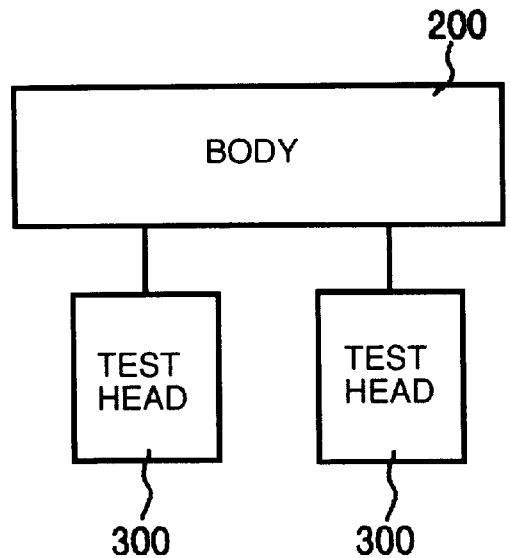
FIGS. 3(A) and 3(B) are views for generally explaining a semiconductor testing device.
Figure 4:
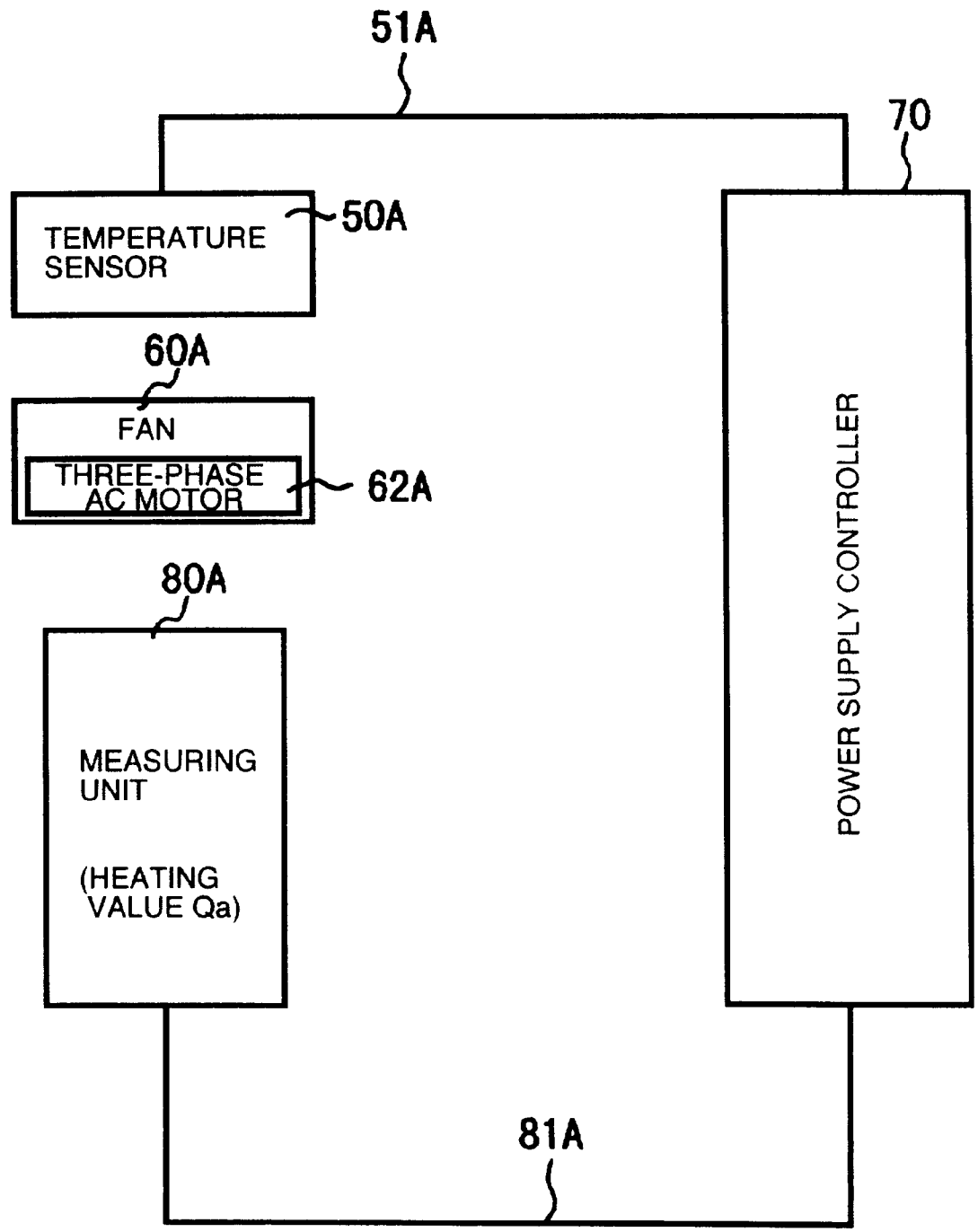
FIG. 4 is a view showing a prior art cooling system of a semiconductor testing device.

Second Embodiment (FIG. 2):

FIG. 2 shows a second embodiment of the present invention, wherein there are provided two measuring units.

That is, there are provided another measuring unit 40B having the same arrangement of the measuring unit 40A in FIG. 1, a temperature sensor 10B for measuring the temperature of the measuring unit 40B, and a fan 20B for cooling the measuring unit 40B when a DC motor 22B is rotated.

Connected to the temperature control-power supply unit 30 are the measuring unit 40B via a power cable 41B, the temperature sensor 10B via a signal cable 11B and the fan 20B via a power cable 21B.

In the second embodiment, the common temperature control-power supply unit 30 is employed, but two temperature control-power supply units 30 may be separately provided corresponding to the measuring unit 40A and the measuring unit 40B. Although there are provided two measuring units in FIG. 2, the number of measuring, units is not limited to two.

The operation of the cooling system of the semiconductor testing device having the arrangement set forth above will be described now.

1. In the case of a single measuring unit:

In the case of single measuring unit as shown in FIG. 1, air which is heated by the heat produced by the measuring unit 40A is drawn by the fan 20A which is driven by the DC motor 22A to cool the measuring unit 40A.

At this time, the present temperature of the measuring unit 40A is measured by the temperature sensor 10A, and the temperature information T issued by the temperature sensor 10A is transmitted to the temperature control-power supply unit 30 via the signal cable 11A. The temperature control-power supply unit 30 always supervises the temperature information T transmitted from the temperature sensor 10A.

In the case that the temperature of the measuring unit 40A does not reach an anomalous temperature value, a voltage V needed for the number of revolutions Ndc of the fan 20A is applied from the temperature control power supply unit 30 to the fan 20A via the power cable 21A so as to obtain air-flow needed for cooling the measuring unit 40A corresponding to heating value Qa.

That is, the heating value Qa is small when the measuring unit 40A is in standby condition and the number of revolutions Ndc of the fan 20A may be small (expression (2)), thereby decreasing the voltage V applied from the temperature control-power supply unit 30 to the fan 20A.

However, the heating value Qa is large when the measuring unit 40A is in operating condition and the number of revolutions Ndc of the fan 20A has to be large (expression (2)), thereby increasing the voltage V applied from the temperature control power supply unit 30 to the fan 20A.

If the temperature of the measuring unit 40A does not reach the anomalous temperature value given power P is supplied from the temperature control-power supply unit 30 to the measuring unit 40A via the power cable 41A.

On the contrary, if the temperature of the measuring unit 40A reaches the anomalous temperature value upon receipt of the temperature information T by the temperature control-power supply unit 30, the temperature control-power supply unit 30 stops the supply of power to the measuring unit 40A and applies the voltage V needed for rotating the fan 20A at the maximum number of revolutions to the fan 20A via the power cable 21A.

When the heating value Qa varies while the measuring unit 40A is in standby condition where the heating value Qa is small and in operating condition where the heating value Qa is large, the operations are repeated in the aforementioned order to execute the optimum control of the number of revolutions Ndc of the fan 20A so as to obtain air-flow needed for cooling the measuring unit 40A corresponding to the heating value.

2.

In the case of two measuring units as shown in FIG. 2, the measuring unit 40A, the fan 20A, the temperature sensor 10A and the temperature control-power supply unit 30 operate in the same manner as the previous case, namely, the case of single measuring unit.

However, regarding the measuring unit 40B, air heated by heat produced by the measuring unit 40B is drawn by the fan 20B which is driven by the DC motor 22B to cool the measuring unit 40B. At this time, the temperature sensor 10B measures the present temperature of the measuring unit 40B and issues temperature information Tb which is transmitted to the temperature control-power supply unit 30 via the signal cable 11B. The temperature control-power supply unit 30 always utilizes the temperature information Tb transmitted from the temperature sensor 10B.

In the case that the temperature of the measuring unit 40B does not reach the anomalous temperature region, a voltage Vb needed for the number of revolutions Ndc of the fan 20B is applied from the temperature control-power supply unit 30 to the fan 20B via the power cable 21B so as to obtain air-flow needed for cooling the measuring unit 40B corresponding to heating value Qb.

That is, the heating value Qb is small when the measuring unit 40B is in standby condition and the number of revolutions Ndc of the fan 20B may be small (expression (2)), thereby decreasing the voltage Vb applied from the temperature control-power supply unit 30 to the fan 20B.

However, the heating value Qb is large when the measuring unit 40B is in operating condition and the number of revolutions Ndc of the fan 20B has to be large (expression (2)), thereby increasing the voltage Vb applied from the temperature control-power supply unit 30 to the fan 20B.

If the temperature of the measuring unit 40B does not reach the anomalous temperature value a given power Pb is supplied from the temperature control-power supply unit 30 to the measuring unit 40B via the power cable 41B.

On the contrary, if the temperature of the measuring unit 40B reaches the anomalous temperature value upon receipt of the temperature information Tb by the temperature control power supply unit 30, the temperature control-power supply unit 30 stops the supply of power to the measuring unit 40B and applies a voltage Vb needed for rotating the fan 20B at the maximum number of revolutions to the fan 20B via the power cable 21B.

When the heating value Qb varies while the measuring unit 40B is in standby condition where the heating value Qb is small and in operating condition where the heating value Qb is large, the operations are repeated in the aforementioned order to execute the optimum control of the number of revolutions Ndc of the fan 20B so as to obtain air-flow needed for cooling the measuring unit 40B corresponding to the heating value.

Meanwhile, even if there are provided not less than three measuring units, there is performed the same operation in the case there are provided not less than two measuring units.

As mentioned in detail, since the cooling system of the semiconductor testing device comprises the fan for cooling the measuring unit by driving the DC motor, the temperature sensor for measuring the temperature of the measuring unit, and the temperature control-power supply unit for supervising the temperature information supplied from the temperature sensor, the number of revolutions of the fan is controlled so as to obtain proper air-flow corresponding the heating value for every operating mode of the measuring unit, thereby producing an effect of preventing the power from being wasted.

What is claimed is:

1. A cooling system of a semiconductor testing device for cooling a measuring unit of the semiconductor testing device comprising:

a fan for cooling the measuring unit by the rotation of a DC motor;

a temperature sensor for measuring a temperature of the measuring unit which is cooled by the fan; and a temperature control/power supply unit for: powering the measuring unit to energize the measuring unit for a plurality of different operating modes;

receiving temperature information which is supplied from the temperature sensor; and regulating operation of the fan to control revolutions of said fan, wherein the temperature control/power supply unit: establishes the revolutions of said fan as a function of the power supplied to the measuring unit for the operating mode of the measuring unit; monitors the temperature information received from the temperature sensor; if the temperature information indicates that the temperature of the measuring unit is below a given temperature value, continues to supply power to the measuring unit;

and, if the temperature information indicates that the temperature of the measuring unit is above the given temperature, stops supplying power to the measuring unit and causes said fan to rotate at a maximum number of revolutions.

2. The cooling system of a semiconductor testing device according to claim 1, wherein the temperature control/power supply unit controls the number of revolutions of the fan by controlling a voltage of the DC motor.

3. The cooling system of a semiconductor testing device according to claim 1, wherein there are provided at least one additional measuring unit, at least one additional fan, and at least one additional temperature sensor.

4. The cooling system of a semiconductor testing device according to claim 1, wherein there are provided at least one additional measuring unit, at least one additional fan, at least one additional temperature sensor and at least one additional temperature control/power supply unit corresponding to the additional elements.

* * * * *